United States Patent [19]

Schumaker

[11] Patent Number: 4,463,431

[45] Date of Patent: Jul. 31, 1984

[54] SIGNAL AMPLITUDE INDICATING APPARATUS

[75] Inventor: John W. Schumaker, Indianapolis, Ind.

[73] Assignee: AT&T Technologies, Inc., New York, N.Y.

[21] Appl. No.: 383,877

[22] Filed: Jun. 1, 1982

[51] Int. Cl.³ .................. H03K 5/153; H03K 5/19
[52] U.S. Cl. ................... 364/480; 328/22; 328/149; 328/115; 363/45; 363/125
[58] Field of Search ............ 328/21, 22, 115, 146, 328/147, 149; 364/481; 363/45, 125; 324/78 D

[56] References Cited

U.S. PATENT DOCUMENTS

| | | | |
|---|---|---|---|
| 3,214,700 | 10/1965 | Hook | 328/165 |
| 3,350,651 | 10/1967 | Davis | 328/22 |
| 3,727,131 | 4/1973 | Puckette | 328/115 |
| 4,112,317 | 9/1978 | Everswick | 328/115 |
| 4,303,979 | 12/1981 | Kato et al. | 324/78 D |

Primary Examiner—John S. Heyman
Attorney, Agent, or Firm—R. F. Kip, Jr.

[57] ABSTRACT

Test equipment for measuring the amplitude of certain a.c. signals and comprising, a signal processing means responsive to each of such a.c. signals for transforming that signal into a d.c. level signal of a magnitude proportional to the r.m.s. amplitude of the a.c. signal, an analog to digital converter responsive only to those of such d.c. signals having magnitudes within an acceptance range for the converter to provide binary indications representative of such magnitudes of those signals, and circuit means for causing only d.c. level signals derived from a.c. signals with r.m.s. amplitudes in a subrange of a full range of such amplitudes to fall within the acceptance range of the converter.

2 Claims, 1 Drawing Figure

SIGNAL AMPLITUDE INDICATING APPARATUS

TECHNICAL FIELD

This invention relates generally to apparatus for indicating the amplitude of a.c. signals which are inputs thereto, and, more particularly, to apparatus of such kind which is conveniently adapted for use to provide quantitative indications of the amplitudes of only those of such signals whose amplitudes fall within a subrange of the entire range of amplitudes which such signals may manifest, although apparatus according to the invention is not necessarily restricted to only such use.

BACKGROUND OF THE INVENTION

In the telecommunications art, tests are performed on equipments, such as telephone sets to determine their commerical acceptability. As part of such tests, it is necessary to measure and indicate the amplitudes of certain a.c. signals produced in operation by such equipments.

For example, a telephone set providing TOUCH-TONE ® dialing has therein an oscillator unit responsive to pressing of each of certain keys on the key pad of the set to generate a different pair of high frequency and low frequency sinusoidal a.c. signals which are audible when converted into sound, each such high frequency signal being a selected one out of four such signals ranging in frequency from about 1150 Hz to about 1700 Hz, and each such low frequency signal being a selected one out of four such signals ranging in frequency from about 650 Hz to about 850 Hz. Thus, the oscillator unit is capable of generating a total of eight signals of different frequency, of which four are high frequency and four are low frequency, and from which there is theoretically available sixteen different pairs of high and low frequency signals of which twelve pairs are used in practice.

In order for the TOUCH-TONE TM telephone set being tested to be commercially acceptable, each of the eight a.c. signals which can so be generated by such oscillator unit must have an r.m.s. amplitude in the range between 300 and 650 millivolts, the size of the range between those two limits being 350 mv. One way used in the past to determine whether or not such signals meet that criterion has been to measure the voltages of such signals with a standard a.c. voltmeter. That technique is, however, disadvantageous in that the voltmeter is hard to read accurately and requires more time for a reading thereof than is desirable. As another shortcoming of such technique, in order to obtain indications of r.m.s. signal amplitudes within the 300–650 millivolt range plus allowing some leeway for indications of amplitudes near to but not falling squarely within that range, the scale used on the voltmeter must extend from 0 volts to above 650 millivolts (as, say, to 1024 millivolts), but the use of a scale of such large size as compared to the 350 mv. size of the range of interest decreases the measuring resolution of the instrument as compared to what it would be if the scale, which could be used thereon were to be about the same size as that of the range of signal amplitudes of interest.

Another technique used in the past for determining whether or not the a.c. signals from the mentioned oscillator unit fall within the acceptable 300–650 mv. range has been to convert such a.c. signals into d.c. signals of magnitudes proportional to the r.m.s. amplitudes of such a.c. signals, and to then feed those d.c. signals to a d.c. comparator unit which is set to provide a "yes" indication if the magnitude of a particular d.c. signal falls within a range corresponding to the acceptable 300–650 mv. range for the a.c. signals, but to otherwise provide a "no" indication. Such "go-no go" kind of indication does not, however, provide the more accurate information on the actual r.m.s. amplitudes of acceptable a.c. signals which is often needed to fully evaluate the performance of the set being tested.

SUMMARY OF THE INVENTION

The above described and other deficiencies of such prior art practices are obviated by apparatus according to the invention comprising input terminals for the mentioned a.c. signals, an A/D (analog-to-digital) converter unit and signal processing stages coupled between such terminals and such unit for rectifying such signals, and then amplifying and filtering such signals to present d.c. level signals derived from such a.c. signals as inputs to the A/D converter unit. That unit is of a kind which has an acceptance range extending between lower and upper adjustable limits. Assuming that the various a.c. signals applied to the apparatus have r.m.s. amplitudes which are fixed for any one signal but vary among them to fall within an r.m.s. amplitude range a in respect of which only signal amplitudes within a subrange b are, quantitatively speaking, of interest, such limits are so set that, in view of the operating parameters of the mentioned signal processing stages of the apparatus, such limits and parameters cooperate to cause only d.c. level signals derived from a.c. signals with r.m.s. amplitudes within that subrange b to come within the acceptance range of the A/D unit and result in binary digital indications therefrom representative of the r.m.s. amplitudes of such a.c. signals. Accordingly, the described apparatus permits such signal amplitudes of quantitative interest to be determined with greater resolution than would be provided by comparable equipment designed to give quantitative indications of a.c. signal amplitudes over the whole r.m.s. amplitude range a. Such apparatus is further capable of providing one or more other advantages of which some will be later described.

BRIEF DESCRIPTION OF DRAWING

For a better understanding of the invention, reference is made to the following description of apparatus which is an exemplary embodiment thereof, and to the sole accompanying drawing, FIG. 1, which consists of a schematic diagram of the circuitry of such apparatus, and of waveform diagrams illustrative of its operation.

CIRCUITRY OF THE APPARATUS

Figure 1:
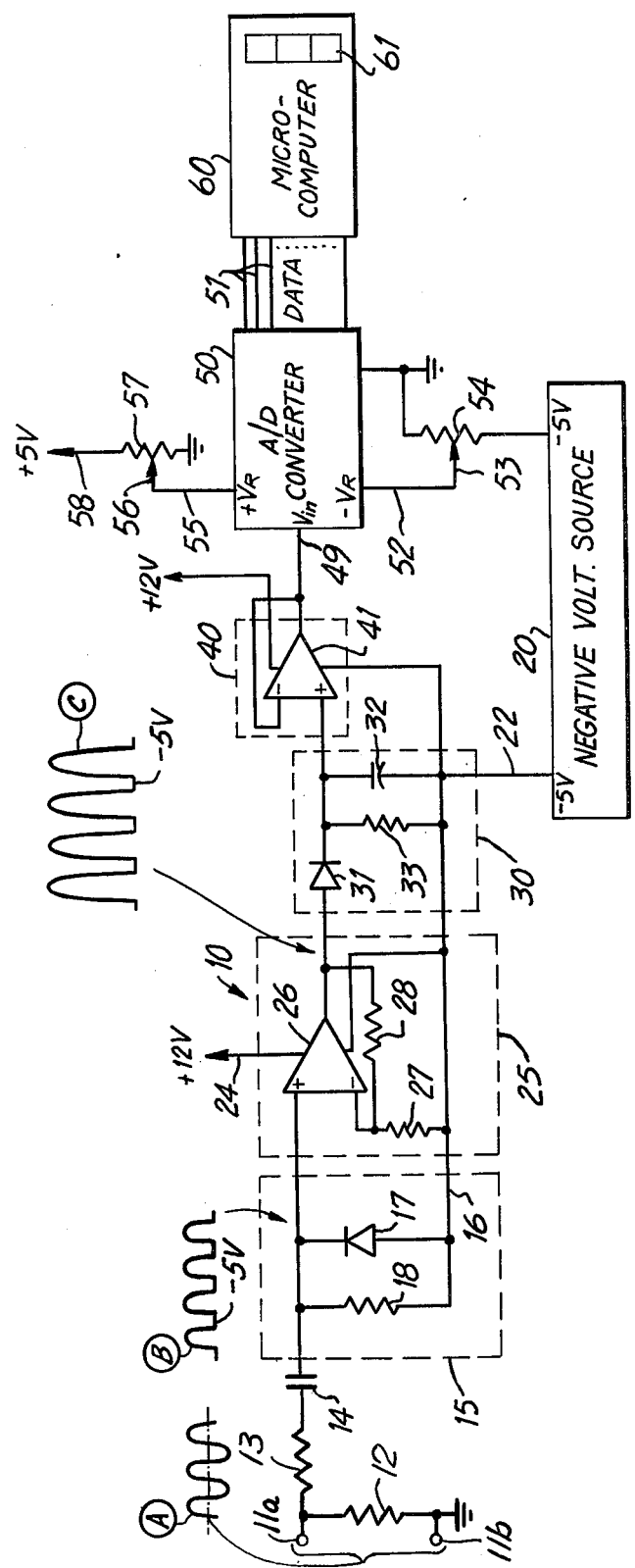

Considering FIG. 1, the reference numeral 10 designates such apparatus which is an exemplary embodiment of the invention. Apparatus 10 has input terminals 11a and 11b for receiving a.c. signals the r.m.s. amplitudes of which are to be determined and indicated, such signals being represented in the drawing by waveform A. When apparatus 10 is used for measuring the amplitudes of a.c. signals from the oscillator unit of a TOUCH-TONE telephone set, such signals are, as heretofore described, sinusoidal signals having different frequencies and having various r.m.s. amplitudes which remain fixed for each signal over its duration, but which may vary from signal to signal over an r.m.s. amplitude a such as, for example, the range between "0" and 762 mv. of which the 762 mv. limit represents a value not likely to be exceeded by the r.m.s. amplitude of any of such signals. Subrange a is divisible into an upper subrange b extending from 250–762 millivolts and a lower subrange c extending from "0" to 250 millivolts. Acceptable r.m.s. amplitudes for such signals extend from 300–650 mv., wherefore all of such acceptable amplitudes will fall within subrange b. The signals applied to terminals 11 are single frequency signals derived from the two-tone signals produced by the mentioned oscillator unit by suppressing one of the frequencies of such two-tone signals.

The terminal 11b of apparatus 10 is connected as shown to a source of a voltage reference level which conveniently may be (but need not be) ground. The two terminals 11 are shunted by a resistor 12 providing a desired input resistance for the apparatus, and terminal 11a is coupled via a resistor 13 and a d.c. isolating capacitor 14 in series to a rectifier stage 15 which is preferably (but not necessarily) a half-wave rectifier, and which is coupled between capacitor 14 and a biasing lead 16. Rectifier stage 15 consists of the parallel combination of a semiconductor diode 17 oriented to pass current towards the capacitor, and a resistor 18 providing a return path for such current. Lead 16 is part of a biasing circuit the principal component of which is a negative voltage source 20 connected by lead 22 to lead 16, and providing on the lead a d.c. bias level which conveniently say −5 volts with respect to the reference level used, i.e., ground. Source 20 may be provided either as a tap from a common power supply for the entire apparatus 10 or as a separate power supply.

Rectifier stage 15 is coupled at its output to an amplifier stage 25 supplied with operating power from a positive voltage source 24, and providing say, +12 volts with respect to ground. Stage 25 comprises an integrated circuit operational amplifier 26 of which one input terminal is connected to the high side of rectifier stage 15 and its other input terminal is connected by resistor 27 to lead 16 and by resistor 28 to the output of the amplifier. Resistors 27 and 28 in series form a voltage divider combination for supplying the output signal from the amplifier 26 with less than unity negative feedback, i.e., with less than the full amount of the signal output of the amplifier, to the input of the amplifier. Accordingly, amplifier 26 amplifies the signal applied thereto by a gain factor k having a value greater than 1.0.

Amplifier stage 25 is coupled to a filtering or "smoothing" stage 30 comprising a semiconductor diode 31 connected to the signal output of amplifier 26 and oriented to conduct current in the direction away from that output. Preferably, but not necessarily, such amplifier stage precedes such filtering stage. Stage 30 further comprises the parallel combination of a capacitor 32 and a resistor 33, such combination being connected at one end to diode 31 and, at the other end, to the biasing lead 16.

The filtering stage 30 is followed by a buffer stage 40 comprising an integrated circuit operational amplifier 41 of which the full signal output is supplied as negative feedback to the input of the amplifier. Accordingly, amplifier 41 is adapted to act as a unity gain device.

The output of buffer stage 40 is coupled to the input 49 of an A/D (analog-to-digital) converter unit 50 adapted (1) to digitally quantize at an n bit level the voltage magnitudes of d.c. level signals at its input which fall within an "acceptance" range over which such quantization will take place, and (2) to provide binary digital indications of such quantized magnitudes in the form of binary signal outputs on n data output lines 51 from the unit, such indications being in the form of n-bit words representative of the voltage magnitudes of such d.c. level signals. Conveniently, but not necessarily, unit 50 may be an 8-bit A/D converter such that n equals 8.

The mentioned acceptance range of unit 50 extends between lower and upper voltage limits which are determined as follows. The lower limit is the voltage value appearing on a lead 52 connected from the unit 50 to the tap 53 of a potentiometer 54 connected between ground and the −5 volt negative voltage source 20, such lower limit voltage value accordingly being of negative polarity relative to the reference level of ground. The upper voltage limit is the voltage value appearing on a lead 55 connected from unit 50 to the tap 56 of a potentiometer 57 connected between ground and a source 58 of positive voltage, such as, for example, +5 volts. Such upper and lower limits are, accordingly, each adjustable in value independent of the other, and such limits may be set to respective selected voltage values by adjustment of the described taps on the described potentiometers.

Evidently, the magnitude or "spread" "X" of the acceptance range between its upper and lower limits can be varied by adjusting those limits to various settings, providing that such acceptance range remains within the capability range of the unit 50, which latter range has a fixed value as, say, 10 volts. The A/D converter unit 50 is of a kind such that, irrespective of the absolute value of "X," the unit will digitally quantize a d.c. level signal which is an input thereto and is within the acceptance range by (1) in effect, dividing "X" into $2^n$ increments (e.g., 256 increments in the case of the present 8-bit converter), (2) determining the difference between the voltage magitude of the input signal relative to a reference level (e.g., ground) and the voltage magnitude of the lower limit of the acceptance range relative to the same reference level, (3) determining the number of each increments which equal such difference, and (4) indicating such number in binary digital form on the data output lines 51 of the unit 50. In the described, apparatus, such difference will necessarily be positive in value if the d.c. input signal to the unit 50 is within its acceptance range. If, however, the d.c. input signal is smaller in value relative to, say, ground than is the lower limit of the acceptance range (i.e., the magnitude of such signal falls outside of and below such range), then such differences will be of negative value, and the magnitude of the input signal will not be quantized by unit 50, but instead, will merely be registered by it as "0." Similarly, if the d.c. input signal to 50 has a magnitude relative to, say, ground greater than the value of the upper limit of the acceptance range of the unit (i.e., the magnitude of such input signal is outside and above the acceptance range of the unit 50), then the input signal level will not be fully quantized by unit 50 and will merely be registered by it as having the same value as such upper limit.

With an A/D converter unit 50 which works as described above, the binary word outputs from the unit are representative of the magnitudes relative to the mentioned reference level (e.g., ground) of d.c. level signals inputted to the unit and within the acceptance range, but such outputs do not explicitly provide the numerical values of such magnitudes, or of the corresponding a.c. signal r.m.s. amplitudes from which such magnitudes are derived and to which they are proportional. For the purpose of arriving at the numerical values of such r.m.s. amplitudes, the data outputs from unit 50 are supplied via the output lines 51 thereof to a microcomputer 60 to become data inputs thereto. Microcomputer 60 is controlled by appropriate software to perform on such inputs certain arithmetic operations (later described) so as to cause the full numerical values of such amplitudes to be as displayed as values in the decimal number system by the display section 61 of the microcomputer.

OPERATION

For purposes both of its calibration and of its use after calibration for measuring and indicating signals, the apparatus 10 operates in the following general manner.

An a.c. signal of the sort described (waveform A) is applied to input terminals 11 and is passed by capacitor 14 to rectifier stage 15. Stage 15 operates in a well-known manner to reproduce the positive half-cycles of the a.c. signal, but to clip off its negative half-cycles so as to yield a half-wave rectified signal. Such signal is, moreover, combined with the minus 5 volts d.c. bias level supplied by biasing lead 16 from the negative voltage source 20. The effect of such combining is to shift the rectified signal in level so that the positive half-cycle waves thereof are in the form of excursions from a base level of −5 volts rather than from a base level of ground. That is, the rectified signal is, in effect, clamped to 31 5 volts. As a result, the shifted rectified signal applied to amplifier stage 25 is of the character depicted by FIG. 1, waveform diagram B. The absence of negative wave cycles in such signal protects the operational amplifier 26 of the stage.

Stage 25 amplifies the input signal thereto by a gain factor k which may be on the order of 10 to produce an amplified half-wave signal which remains clamped to the base level of −5 volts, and which is of the character shown by FIG. 1, waveform diagram C. The amplified signal is then passed to filtering stage 30 to be converted thereby into a d.c. level signal which is substantially free of any a.c. frequency components, and which, like its predecessor d.c. signals, remains clamped in the −5 volts base level. The magnitude of the d.c. level signal relative to that base level is substantially equal to the peak amplitude of the positive half-wave excursions from base level of the rectified signal output from stage 25, and such peak amplitude is, as is well known, proportional to the r.m.s. amplitude of the a.c. signal (at terminals 11) from which the rectified signal is derived. Hence, the magnitude of the d.c. level signal relative to the −5 volts base level is also proportional to such r.m.s. amplitude.

The d.c. level signal is applied from filtering stage 30 to stage 40 which provides a buffering effect so that the d.c. level at the output of stage 30 is not reduced by having such stage connected directly to the input of unit 50. The signal is then supplied via lead 49 to the input of the converter unit 50 in connection with which taps 53 and 56 are set to cause the unit to produce binary digital indications on its output lines 51 in response to receipt by the unit of a d.c. level signal derived from an a.c. signal having an r.m.s. amplitude between, say, 250 and 762 millivolts. Those binary digital indications are applied by lines 51 to microcomputer 60 which converts such indications into a numerical reading made visible by the display section 61 of the microcomputer.

As a matter of convenience in describing further how the apparatus 10 is calibrated and operated, it will be assumed that in such apparatus the gain factor k of stage 25, and the operating parameters of the other signal processing stages are such that a.c. input signals to the apparatus which have respective r.m.s. amplitudes of 0 and 762 millivolts will produce d.c. level signals on lead 49 of which the magnitudes relative to the −5 volts base level are, respectively, 0 volts and 7.62 volts. It is to be understood, however, that the operation of apparatus 10 is in no wise limited to that particular proportional relation.

With such assumed relationship characterizing the operation of apparatus 10, it is calibrated as follows. First, an a.c. calibrating signal of 250 mv. r.m.s. amplitude is applied to terminals 11 to yield on lead 49 a d.c. level signal with a magnitude of +2.5 volts relative to the −5 volt base level or, in other words, −2.5 volts relative to ground. Tap 53 is then set such that the voltage on lead 52 is equal to −2.5 volts relative to ground, wherefore there is 0 voltage difference between such lower limit and the d.c. level calibrating signal.

Next, an a.c. calibrating signal of 762 mv. is applied to terminals 11 to yield a d.c. level signal on lead 49 of +7.62 volts relative to the −5 volt base level or, to put it another way, +2.62 volts relative to ground. Thereafter, tap 56 is set to provide +2.62 volts relative to ground on lead 55 so as to produce 0 voltage difference between the second d.c. level calibrating signal and the upper limit for the acceptance range of converter unit 50. The acceptance range has, thus, been established as extending between −2.50 volts relative to ground and +2.62 volts relative to ground so as to have a total spread of 5.12 volts. It will be noted that such acceptance range corresponds to the r.m.s. amplitude subrange b of 512 mv. extending between 250 and 762 mv. for the described a.c. signals. For digital quantizing purposes, the 8-bit A/D converter unit 50 divides its 5.12 volt acceptance range into 256 increments, each such increment corresponding, therefore, to 0.02 volt in the acceptance range of unit 50 and to 2 mv. in the mentioned subrange b.

Having so calibrated apparatus 10, various of the described a.c. signals obtained from the testing of TOUCH-TONE telephone sets are now applied to the apparatus for purposes of obtaining indications of the r.m.s. amplitudes of such signals. As stated, such amplitudes must be between 300 and 640 mv. for such a.c. signals to be satifactory outputs from the sets.

Assume that such an applied signal has an r.m.s. amplitude of 550 mv. That signal by virtue of the operation of calibrated apparatus 10 will cause the production on the input lead 49 to unit 50 of a d.c. level signal having a magnitude of +5.5 volts relative to the −5 volt base level or, what is the same, of +0.5 volts relative to ground, such d.c. level signal being within the assumed acceptance range of unit 50. By the described calibration, the lower limit of such acceptance range has been set to −2.5 volts relative to ground. The difference between the magnitude of the d.c. level signal and such lower limit is, hence, +3.0 volts (the sign for the difference between positive because the d.c. level signal is greater in voltage than the lower limit). Accordingly, unit 50 will produce on its output lines 51 a set of signals expressing in binary form the number 150 which is the number of the mentioned increments included in that 3.0 volt difference. Such number, however, does not give explicitly the r.m.s. amplitude of the input a.c. signal.

To obtain such explicit indication, the data outputs from unit 50 are fed by lines 51 to microprocessor 60 which, in the assumed circumstances and under the control of its software, performs the operations of (1) multiplying by 2 the number expressed by those outputs, (2) adding to the product so obtained a constant which is the number 250, and (3) converting the resulting number from binary form to decimal form and displaying the decimal number by the section 61 of the microcomputer. Hence, the overall response of the apparatus to the assumed a.c. input signal with an r.m.s. amplitude of 550 mv. will be a displaying by section 61 of the number "550." In a similar fashion, the apparatus will display the r.m.s. amplitude of any other signal of the sort described of which the amplitude is within the mentioned subrange b. Because the digital increments into which the acceptance range is divided correspond to subdivisions of that subrange b and, hence, are smaller in voltage value than if they were to correspond to subdivisions of the mentioned range a, the apparatus 10 is enabled to measure and indicate the r.m.s. amplitudes of applied a.c. signals with substantially better resolution than if the acceptance range of the unit corresponded to an amplitude range for such signals equal to or greater than range a.

It will be noted that, when unit 50 is calibrated by the procedure described above, and so long as the spread "X" of the acceptance range of unit 50 does not exceed the maximum value for that range for which the unit capable of affecting A/D conversion (such maximum value being, say, 10 volts), unit 50 will operate as described above independent of the value of "X" or of variations in such value. It is desirable, however, for "X" to be close to its maximum allowable size, and such close approximation can be realized by, for example, changing the voltage at source 58 from +5 volts to +10 volts so that the acceptance range corresponding to subrange b can approach 10 volts. In such case, however, care must be taken to assure that the maximum size for the acceptance range is not exceeded as a result of setting of the taps 53 and 56.

It should, also, be noted that, while the negative biasing provided by source 20 yields certain advantages, such negative biasing can be replaced by ground biasing or even positive biasing, and the apparatus 10 will, with appropriate adjustments, still suitably operate as described to indicate the r.m.s. amplitudes of a.c. input signals.

Besides the improved resolution discussed above, apparatus 10 is characterized by the advantage of good linearity of tracking between the actual r.m.s. amplitude values of the input a.c. signals and the indications of such amplitude values registered by the display section 61 of the microcomputer. As another advantage, because the operation of the apparatus is independent of variation in the spread "X" of the acceptance range of unit 50 so long as "X" stays within the capability of the unit, the apparatus can be easily recalibrated to correct for any drift occuring over time in the operating parameters of the signal processing stages preceding unit 50.

DETAILS OF CONSTRUCTION

The converter unit 50 may be an eight-bit analog-to-digital converter, model AD0800, manufactured by Analog Devices, Inc. The amplifiers 26 and 41 each may be an integrated circuit operational amplifier, model LM 324, manufactured by National Semiconductor. Appropriate values for the various other circuit elements shown in FIG. 1 will be readily apparent to one skilled in the art from the description given above.

The above described embodiment being exemplary only, additions thereto, omissions therefrom and modifications thereof can be made without departing from the spirit of the invention. For example, the mentioned subrange b of the assigned amplitude range a for the a.c. signals need not be the upper part of that range a, but can be any part of such range.

What is claimed is:

1. Indicating apparatus for a.c. signals having various fixed r.m.s. amplitudes falling within an r.m.s. amplitude range a consisting of r.m.s. amplitude subranges b and c of which c is the lower of said subranges, said apparatus comprising, input terminals for said a.c. signals, a half-wave rectifier stage coupled to said terminals for converting such a.c. signals thereon into half-wave rectified signals of which the respective peak magnitudes relative to a reference level are proportional to the respective r.m.s. amplitudes of such a.c. signals, amplifier and filtering stages for amplifying said rectified signals and for filtering them to convert them into d.c. level signals substantially free of a.c. frequency components, an n-bit A/D converter unit coupled to said last-named stages for receiving said d.c. level signals as inputs, said unit having for such inputs an acceptance range of voltage extending between adjustable lower and upper limits and being subdivisible by such unit into $2^n$ digital increments, and said unit being selectively responsive to those of said d.c. level signals having voltage values within said acceptance range to convert only those of said d.c. level signals with such values into n binary digital outputs indicating in binary form the number of such increments included between the voltage level of each of those signals and the lower limit of said acceptance range, circuit means for setting said lower and upper limits to the same voltage values as those of d.c. level signals corresponding to, respectively, ones of said a.c. signals having the r.m.s. amplitudes characterizing the lower and upper ends of said subrange b, and computer means responsive to said n digital outputs for (i) multiplying the number expressed thereby by a factor equal to the size of subrange b divided by $2^n$, (ii) adding to the product thereby obtained a constant number expressing the size of subrange c, and (iii) converting the resulting number into decimal notation and displaying such decimal number.

2. Indicating apparatus for a.c. signals having various fixed r.m.s. amplitudes falling within an r.m.s. amplitude range a consisting of r.m.s. amplitude subranges b and c of which c is the lower of said subranges, said apparatus comprising, input terminals for said a.c. signals, signal processing means for converting such a.c. signals thereon into d.c. level signals substantially free of a.c. frequency components and having magnitude relative to a reference level which are proportional to the r.m.s. amplitudes of the corresponding signals from which such d.c. level signals are respectively derived, an n-bit A/D converter unit coupled to said last-named stages for receiving said d.c. level signals as inputs, said unit having for such inputs an acceptance range of voltage extending between adjustable lower and upper limits and being subdivisible by such unit into $2^n$ digital increments, and said unit being selectively responsive to those of said d.c. level signals having voltage values within said acceptance range to convert only those of said d.c. level signals with such values into n binary digital outputs indicating in binary form the number of such increments included between the voltage level of each of those signals and the lower limit of said acceptance range, circuit means for setting said lower and upper limits to the same voltage values as those of d.c. level signals corresponding to, respectively, ones of said a.c. signals having the r.m.s. amplitudes characterizing the lower and upper ends of said subrange b, and computer means responsive to said n digital outputs for (i) multiplying the number expressed thereby by a factor equal to the size of subrange b divided by $2^n$, (ii) adding to the product thereby obtained a constant number expressing the size of subrange c, and (iii) converting the resulting number into decimal notation and displaying such decimal number.

* * * * *